(12) United States Patent
Kim et al.

(10) Patent No.: US 10,586,775 B2
(45) Date of Patent: Mar. 10, 2020

(54) MEMORY PACKAGES AND RELATED SEMICONDUCTOR PACKAGES

(71) Applicant: Samsung Electronics Co., Ltd., Suwon-si, Gyeonggi-do (KR)

(72) Inventors: Dong-Uk Kim, Seoul (KR); Il-Joon Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/174,934

(22) Filed: Oct. 30, 2018

(65) Prior Publication Data

US 2019/0229076 A1 Jul. 25, 2019

(30) Foreign Application Priority Data

Jan. 22, 2018 (KR) ........................ 10-2018-0007522

(51) Int. Cl.
*H01L 23/498* (2006.01)
*H01L 23/66* (2006.01)
(Continued)

(52) U.S. Cl.
CPC ........ *H01L 23/66* (2013.01); *H01L 23/49811* (2013.01); *H01L 23/49822* (2013.01);
(Continued)

(58) Field of Classification Search
CPC ............. H01L 25/0657; H01L 25/0652; H01L 25/105; H01L 25/18; H01L 25/043; H01L 25/074; H01L 25/0756; H01L 25/117; H01L 23/49822; H01L 23/49838; H01L 23/522; H01L 2924/15174; H01L 2224/73265; H01L 2224/48227;
(Continued)

(56) References Cited

U.S. PATENT DOCUMENTS 7,667,557 B2  2/2010  Chen
7,863,736 B2  1/2011  Chung
(Continued)

FOREIGN PATENT DOCUMENTS

JP  2004-320556 A  11/2004
JP  2013-115409 A  6/2013
(Continued)

*Primary Examiner* — Hsien Ming Lee
(74) *Attorney, Agent, or Firm* — Sughrue Mion, PLLC

(57) ABSTRACT

A memory package includes a multi-level package substrate, a first memory chip, a second memory chip, a first band pass filter and a second band pass filter. The multi-level package substrate includes a plurality of wiring layers and a plurality of insulating layers alternately stacked on one another. The first memory chip is on the multi-level package substrate, and includes a plurality of first memory cells and a first receiver. The second memory chip is on the first memory chip, and includes a plurality of second memory cells and a second receiver. The first band pass filter is in the multi-level package substrate, is connected to the first receiver, and passes a first data signal within a first frequency band. The second band pass filter is in the multi-level package substrate, is connected to the second receiver, and passes a second data signal within the first frequency band.

20 Claims, 11 Drawing Sheets

(51) Int. Cl.
*H01L 25/065* (2006.01)
*H01L 25/10* (2006.01)
*H01L 23/00* (2006.01)
*H03H 7/01* (2006.01)
*H03H 7/38* (2006.01)
*H03H 1/00* (2006.01)

(52) U.S. Cl.
CPC ........ *H01L 23/49838* (2013.01); *H01L 24/48* (2013.01); *H01L 25/0652* (2013.01); *H01L 25/0657* (2013.01); *H01L 25/105* (2013.01); *H03H 7/0115* (2013.01); *H03H 7/38* (2013.01); *H01L 24/32* (2013.01); *H01L 24/73* (2013.01); *H01L 24/83* (2013.01); *H01L 2223/6611* (2013.01); *H01L 2224/32014* (2013.01); *H01L 2224/32145* (2013.01); *H01L 2224/32225* (2013.01); *H01L 2224/48091* (2013.01); *H01L 2224/48225* (2013.01); *H01L 2224/48227* (2013.01); *H01L 2224/73265* (2013.01); *H01L 2224/8385* (2013.01); *H01L 2225/0651* (2013.01); *H01L 2225/06562* (2013.01); *H01L 2225/06586* (2013.01); *H01L 2225/1035* (2013.01); *H01L 2924/00014* (2013.01); *H01L 2924/1431* (2013.01); *H01L 2924/1436* (2013.01); *H01L 2924/15174* (2013.01); *H01L 2924/15311* (2013.01); *H01L 2924/181* (2013.01); *H01L 2924/19051* (2013.01); *H03H 2001/0085* (2013.01)

(58) Field of Classification Search
CPC ....... H01L 2224/32145; H01L 2224/46; H01L 2225/0651
See application file for complete search history.

(56) References Cited

U.S. PATENT DOCUMENTS

| | | | |
|---|---|---|---|
| 8,891,246 B2 * | 11/2014 | Guzek | ............... H01L 23/49816 361/707 |
| 9,148,108 B2 | 9/2015 | Jang | |
| 2011/0133773 A1 | 6/2011 | Shau | |
| 2017/0264259 A1 | 9/2017 | Dedic et al. | |

FOREIGN PATENT DOCUMENTS

| | | |
|---|---|---|
| KR | 10-0550877 B1 | 2/2006 |
| KR | 10-1345887 B1 | 12/2013 |

* cited by examiner

MEMORY PACKAGES AND RELATED SEMICONDUCTOR PACKAGES

CROSS-REFERENCE TO RELATED APPLICATION

This application claims priority under 35 USC § 119 to Korean Patent Application No. 10-2018-0007522, filed on Jan. 22, 2018 in the Korean Intellectual Property Office (KIPO), the contents of which are herein incorporated by reference in their entirety.

FIELD

The inventive concept generally relates to memory packages and, more particularly, to memory packages including memory chips and semiconductor packages including memory chips and different types of chips.

BACKGROUND

As an operating speed of a semiconductor memory device has increased, swing widths of signals interfaced between the semiconductor memory device and a memory controller have decreased. A reason for the decrease of the swing widths is to reduce the time required to transmit the signals. However, as the swing widths have decreased, the signals transferred between the semiconductor memory device and the memory controller may be more easily distorted and reflected. To improve the distortion of the transferred signals, the semiconductor memory device may include an on-die termination (ODT) circuit that provides a signal transmission line with a termination resistance component for impedance matching. The ODT circuit may reduce (and/or prevent) the signals from being reflected by using the termination resistor so as to improve signal integrity, however, power consumption may increase due to an ODT operation performed by the ODT circuit. Researchers are conducting various research projects on techniques of reducing the power consumption and improving the signal integrity.

SUMMARY

Some embodiments of the present inventive concept provide a memory package capable of efficiently reducing power consumption and improving signal integrity.

Further embodiments of the present inventive concept provide a semiconductor package capable of efficiently reducing power consumption and improving signal integrity.

Still further embodiments provide a memory package that includes a multi-level package substrate, a first memory chip, a second memory chip, a first band pass filter and a second band pass filter. The multi-level package substrate includes a plurality of wiring layers and a plurality of insulating layers that are alternately stacked on one another. The first memory chip is formed on the multi-level package substrate, and includes a plurality of first memory cells and a first receiver. The second memory chip is formed on the first memory chip, and includes a plurality of second memory cells and a second receiver. The first band pass filter is formed in the multi-level package substrate, is connected to the first receiver, and passes a first data signal within a first frequency band. The second band pass filter is formed in the multi-level package substrate, is connected to the second receiver, and passes a second data signal within the first frequency band.

Some embodiments of the present inventive concept provide a semiconductor package including a multi-level package substrate, a controller chip, a first memory chip, a second memory chip, a first band pass filter and a second band pass filter. The multi-level package substrate includes a plurality of wiring layers and a plurality of insulating layers that are alternately stacked on one another. The controller chip is formed on the multi-level package substrate, and receives a first data signal and a second data signal. The first memory chip is formed on the multi-level package substrate, is spaced apart from the controller chip, and includes a plurality of first memory cells and a first receiver. The second memory chip is formed on the first memory chip, and includes a plurality of second memory cells and a second receiver. The first band pass filter is formed in the multi-level package substrate, is connected to the first receiver, and passes the first data signal within a first frequency band. The first data signal is output from the controller chip. The second band pass filter is formed in the multi-level package substrate, is connected to the second receiver, and passes a second data signal within the first frequency band. The second data signal is output from the controller chip.

Further embodiments of the present inventive concept provide a semiconductor package including a lower package substrate, a controller chip, a multi-level upper package substrate, a first memory chip, a second memory chip, a first band pass filter and a second band pass filter. The controller chip is formed on the lower package substrate, and receives a first data signal and a second data signal. The multi-level upper package substrate is formed on the lower package substrate on which the controller chip is formed, and includes a plurality of wiring layers and a plurality of insulating layers that are alternately stacked on one another. The first memory chip is formed on the multi-level upper package substrate, and includes a plurality of first memory cells and a first receiver. The second memory chip is foitned on the first memory chip, and includes a plurality of second memory cells and a second receiver. The first band pass filter is formed in the multi-level upper package substrate, is connected to the first receiver, and passes the first data signal within a first frequency band. The first data signal is output from the controller chip. The second band pass filter is formed in the multi-level upper package substrate, is connected to the second receiver, and passes a second data signal within the first frequency band. The second data signal is output from the controller chip.

In still further embodiments, the memory chips included in the memory package and the semiconductor package may not include the ODT circuit, and the ODT circuit may be replaced with the band pass filter. Unlike the ODT circuit, the band pass filter may not be included in the memory chip, but may be formed and included in the multi-level package substrate. Power consumption may be reduced and signal integrity may be improved using the band pass filter.

In some embodiments, since the band pass filter does not include a resistor and includes only the capacitor and the inductor, a DC path between the power supply voltage and the ground voltage may not be formed, and thus the power consumption of the memory chip may be reduced. Furthermore, the signal integrity may be improved based on increasing of eye opening ratio, inductor behavior, blocking of high frequency noise, and decreasing of total capacitance.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Figure 1:
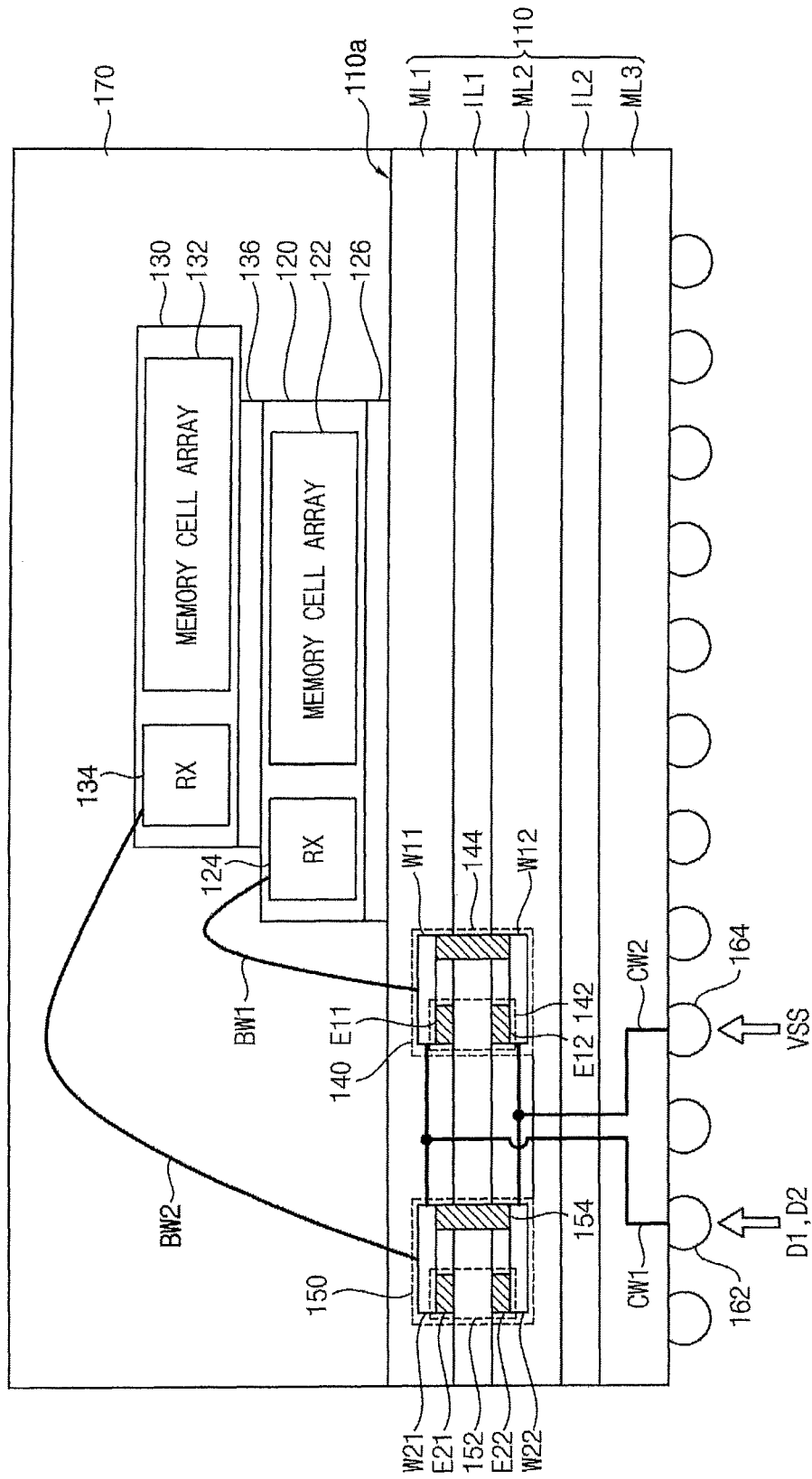
FIG. 1 is a cross-section illustrating a memory package according to some embodiments of the present inventive concept.

Various embodiments will be discussed more fully with reference to the accompanying drawings, in which embodiments are shown. The present disclosure may, however, be embodied in many different forms and should not be construed as limited to the embodiments set forth herein. Like reference numerals refer to like elements throughout this application.

Referring first to FIG. 1, a cross section illustrating a memory package according to some embodiments of the present inventive concept will be discussed. As illustrated in FIG. 1, a memory package 100 includes a multi-level package substrate 110, a first memory chip 120, a second memory chip 130, a first band pass filter (BPF) 140 and a second band pass filter 150. The memory package 100 may further include a plurality of adhesive members 126 and 136, a plurality of conductive bumps 162 and 164, a plurality of connection lines CW1 and CW2, a plurality of bonding wires BW1 and BW2, and a sealing member 170.

The multi-level package substrate 110 includes a plurality of wiring layers ML1, ML2 and ML3 and a plurality of insulating layers IL1 and IL2 that are alternately stacked on one another. For example, the multi-level package substrate 110 may include first, second and third wiring layers ML1, ML2 and ML3 that are sequentially stacked on one another, a first insulating layer IL1 between the first and second wiring layers ML1 and ML2, and a second insulating layer IL2 between the second and third wiring layers ML2 and ML3. Although FIG. 1 illustrates the multi-level package substrate 110 including three wiring layers ML1, ML2 and ML3 and two insulating layers IL1 and IL2, inventive concepts are not limited thereto. For example, the number of wiring layers and the number of insulating layers in the multi-level package substrate may be changed.

The first memory chip 120 is formed on the multi-level package substrate 110. The first memory chip 120 includes a first memory cell array 122 and a first receiver (RX) 124. The first receiver 124 may receive a first data signal D1 that is provided from an external device located outside the memory package 100. The first memory cell array 122 may include a plurality of first memory cells and may store data (e.g., first data corresponding to the received first data signal D1). A first adhesive member 126 may intervene between the multi-level package substrate 110 and the first memory chip 120.

The second memory chip 130 is formed on the first memory chip 120. In other words, the first memory chip 120 and the second memory chip 130 may be implemented with a multi-stacked structure. The second memory chip 130 includes a second memory cell array 132 and a second receiver 134. The second receiver 134 may receive a second data signal D2 that is provided from the external device. The second memory cell array 132 may include a plurality of second memory cells and may store data (e.g., second data corresponding to the received second data signal D2). A second adhesive member 136 may intervene between the first memory chip 120 and the second memory chip 130.

In some embodiments, the first memory chip 120 and the second memory chip 130 may have the same structure. In some embodiments, each of the first memory chip 120 and the second memory chip 130 may include a dynamic random access memory (DRAM) device. A configuration of a DRAM device will be discussed in detail with reference to FIG. 7. Although FIG. 1 illustrates an example where the first memory chip 120 and the second memory chip 130 are stacked scalariformly, that is, in a step shape, for relatively easily arranging the plurality of bonding wires BW1 and BW2, inventive concepts are not limited thereto. For example, the first memory chip and the second memory chip may be stacked such that the first memory chip and the second memory chip are completely overlapped (e.g., the first memory chip and the second memory chip are perfectly matched with each other).

In some embodiments, each of the first adhesive member 126 and the second adhesive member 136 may include an insulation material.

The first band pass filter 140 is formed in the multi-level package substrate 110 and is connected to the first receiver 124 included in the first memory chip 120. The first band pass filter 140 performs a function of passing the first data signal D1 within a first frequency band. The second band pass filter 150 is formed in the multi-level package substrate 110 and is connected to the second receiver 134 included in the second memory chip 130. The second band pass filter 150 performs a function of passing the second data signal D2 within the first frequency band. The first band pass filter 140 and the second band pass filter 150 may have the same structure.

Unlike a conventional memory chip or a conventional memory device, each of the memory chips 120 and 130 included in the memory package 100 according to embodiments may not include an on-die termination (ODT) circuit that performs an ODT operation for impedance matching and for reducing a signal from being reflected. In the memory package 100 according to embodiments, the ODT circuit may be replaced with each of the band pass filters 140 and 150. Unlike the ODT circuit, each of the band pass filters 140 and 150 may not be included in a respective one of the memory chips 120 and 130, but may be formed and included in the multi-level package substrate 110. As will be discussed with reference to FIGS. 2 through 5, power consumption may be reduced and signal integrity may be improved using the band pass filters 140 and 150.

In some embodiments, each of the first and second band pass filters 140 and 150 may be implemented with a vertical structure. In other words, each of the first and second band pass filters 140 and 150 may include at least one passive element that is formed substantially vertically with respect to a first surface (e.g., a top surface) 110a of the multi-level package substrate 110 such that the at least one passive element is included in both two wiring layers (e.g., both the first wiring layer ML1 and the second wiring layer ML2).

For example, the first band pass filter 140 may include a first capacitor 142 and a first inductor 144 that are connected in parallel with each other. In other words, the first band pass filter 140 may be implemented with an inductance-capacitance (LC) filter. The first capacitor 142 may include a first electrode E11 formed in the first wiring layer ML1 and a second electrode E12 formed in the second wiring layer ML2. The first inductor 144 may be formed to penetrate the first insulating layer IL1.

The first band pass filter 140 may further include a first line W11 and a second line W12. The first line W11 may be formed in the first wiring layer ML1 and may connect the first electrode E11 of the first capacitor 142 with a first end of the first inductor 144. The second line W12 may be formed in the second wiring layer ML2 and may connect the second electrode E12 of the first capacitor 142 with a second end of the first inductor 144. The first capacitor 142 and the first inductor 144 may be connected in parallel with each other by the first line W11 and the second line W12.

As with the first band pass filter 140, the second band pass filter 150 may include a second capacitor 152 and a second inductor 154 that are connected in parallel with each other, and may further include a third line W21 and a fourth line W22. The second capacitor 152 may include a third electrode E21 formed in the first wiring layer ML1 and a fourth electrode E22 formed in the second wiring layer ML2. The second inductor 154 may be formed to penetrate the first insulating layer IL1. The third line W21 may be formed in the first wiring layer ML1 and may connect the third electrode E21 of the second capacitor 152 with a first end of the second inductor 154. The fourth line W22 may be formed in the second wiring layer ML2 and may connect the fourth electrode E22 of the second capacitor 152 with a second end of the second inductor 154.

In some embodiments, each of the first capacitor 142 and the second capacitor 152 may include a multi-layer ceramic capacitor (MLCC). In some embodiments, each of the first inductor 144 and the second inductor 154 may include a via or an electrode that penetrates the first insulating layer IL1.

The plurality of conductive bumps 162 and 164 may be disposed on a second surface (e.g., a bottom surface) of the multi-level package substrate 110 for electrical connections to the external device. For example, a first conductive bump 162 may receive the first data signal D1 and the second data signal D2 from the external device. A second conductive bump 164 may receive a ground voltage VSS from the external device.

A first connection line CW1 may connect the first conductive bump 162 with the first and third lines W11 and W21. A second connection line CW2 may connect the second conductive bump 164 with the second and fourth lines W12 and W22. For convenience of illustration, FIG. 1 illustrates each of the first and second connection lines CW1 and CW2 by a single line, however, each of the first and second connection lines CW1 and CW2 may include at least one wiring and at least one via.

A first bonding wire BW1 may connect the first band pass filter 140 with the first memory chip 120. A second bonding wire BW2 may connect the second band pass filter 150 with the second memory chip 130. For example, the first bonding wire BW1 may connect the first line W11 with the first receiver 124, and the second bonding wire BW2 may connect the third line W21 with the second receiver 134.

The first memory chip 120, the second memory chip 130, the first bonding wire BW1 and the second bonding wire BW2 may be fixed by the sealing member 170.

In some embodiments, the first conductive bump 162, the first connection line CW1, the first line W11 and the first bonding wire BW1 may be included in or formed on a first path (e.g., a first path P1 in FIGS. 2 and 3) for transmitting the first data signal D1 to the first receiver 124. The first conductive bump 162, the first connection line CW1, the third line W21 and the second bonding wire BW2 may be included in or formed on a second path for transmitting the second data signal D2 to the second receiver 134. Although FIG. 1 illustrates an example where some of the first and second paths (e.g., the first conductive bump 162 and the first connection line CW1) may be shared with each other, inventive concepts are not limited thereto. For example, the first path and the second path may be totally separated from each other, and the first data signal D1 and the second data signal D2 may be received from the external device at different conductive bumps.

The ground voltage VSS received at the second conductive bump 164 may be provided to the first band pass filter 140 and the second band pass filter 150. Although not illustrated in FIG. 1, the ground voltage VSS may also be provided to the first memory chip 120 and the second memory chip 130.

In some embodiments, at least a part of the lines W11, W12, W21 and W22, the connection lines CW1 and CW2, the electrodes E11, E12, E21 and E22, and the vias in the inductors 144 and 154 may include a conductive material such as a metal, a polysilicon, etc. In some embodiments, the insulating layers IL1 and IL2 may include an insulation material such as a silicon oxide.

Figure 2:
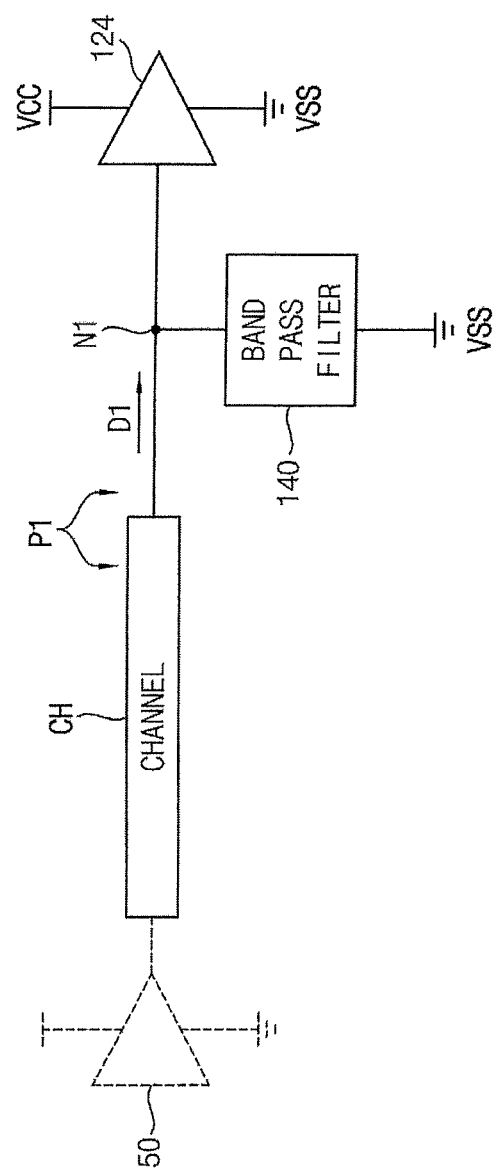
FIGS. 2 and 3 are diagrams illustrating a connection between a band pass filter and a receiver that are included in a memory package according to some embodiments of the present inventive concept.
Figure 3:
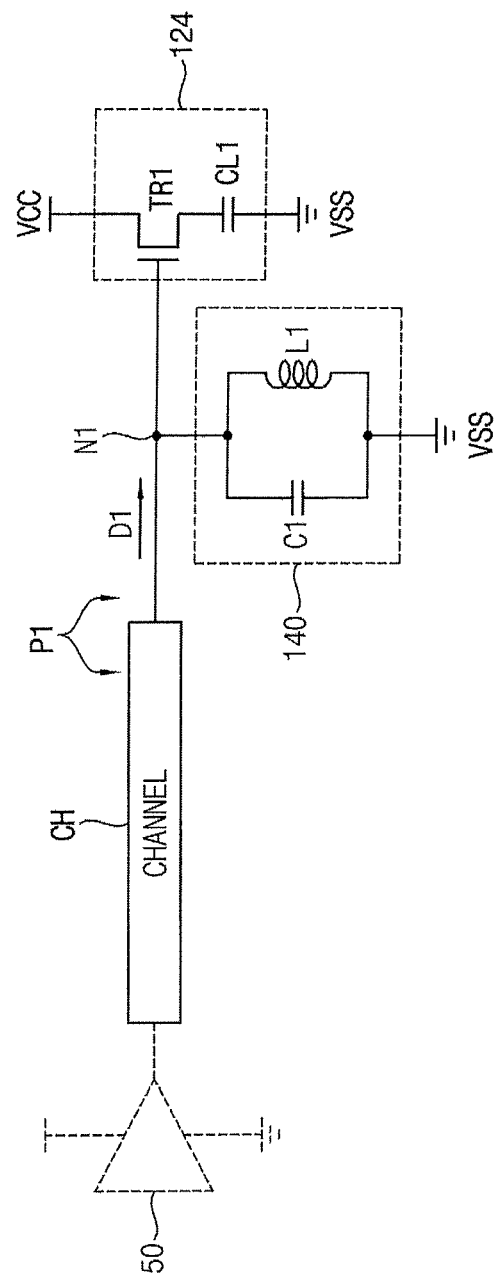

FIGS. 2 and 3 are diagrams illustrating a connection between a band pass filter and a receiver that are included in a memory package according to some embodiments. FIG. 2 is a block diagram illustrating the first receiver 124, the first band pass filter 140 connected to the first receiver 124, and the first path P1 for transmitting the first data signal D1 to the first receiver 124 that are included in the first memory chip 120 in FIG. 1. FIG. 3 is a circuit diagram illustrating equivalent circuits of the first receiver 124 and the first band pass filter 140 in FIG. 2.

Referring to FIGS. 1 and 2, the first data signal D1 may be output from a transmitter 50 that is included in an external controller chip (not illustrated), and may be transmitted to the first receiver 124 in the first memory chip 120 through the first path P1.

The first path P1 may include a channel CH and a path between the channel CH and the first receiver 124. The channel CH may represent a signal path that is formed between the external controller chip and the memory package 100. The path between the channel CH and the first receiver 124 may include the first conductive bump 162, the first connection line CW1, the first line W11 and the first bonding wire BW1 in FIG. 1.

The first band pass filter 140 may be connected to a first node N1 that is formed on the first path P1 for transmitting the first data signal D1 to the first receiver 124. For example, the first band pass filter 140 may be connected between the first node N1 and the ground voltage VSS.

The first receiver 124 may receive the first data signal D1 and may be connected between a power supply voltage VCC and the ground voltage VSS.

Referring to FIGS. 1 and 3, the first band pass filter 140 may include a first capacitor C1 and a first inductor L1 that are connected in parallel between the first node N1 and the ground voltage VSS. The first capacitor C1 and the first inductor L1 may correspond to the first capacitor 142 and the first inductor 144 in FIG. 1, respectively. The first frequency band (e.g., a pass band) for passing the first data signal D1 and the other frequency bands (e.g., stop bands) for blocking noise signals other than the first data signal D1 may be determined by setting or adjusting a capacitance of the first capacitor C1 and an inductance of the first inductor L1.

The first receiver 124 may be modeled to an equivalent circuit including a first transistor TR1 and a first load capacitor CL1 that are connected in series between the power supply voltage VCC and the ground voltage VSS. The first transistor TR1 may include a first electrode connected to the power supply voltage VCC, a control electrode receiving the first data signal D1, and a second electrode. The first load capacitor CL1 may be connected between the second electrode of the first transistor TR1 and the ground voltage VSS. The amount of a current flowing through the first receiver 124 may be changed according to a voltage level of the first data signal D1, and thus a value of the first data signal D1 may be detected or sensed based on the amount of a current flowing through the first receiver 124.

An ODT circuit included in a conventional memory chip includes a termination resistor connected between the first node N1 and the ground voltage VSS. A signal reflection at an interface between two memory chips may be reduced by impedance matching based on the termination resistor, and thus signal integrity may be improved. However, a DC path may be formed between the power supply voltage VCC and the ground voltage VSS by the termination resistor, and thus power consumption of the memory chip may increase due to the DC path.

The memory package 100 according to embodiments may include the band pass filter 140 for replacing the ODT circuit. The band pass filter 140 may not be included in the memory chip 120, but may be formed in the multi-level package substrate 110 located outside the memory chip 120. Since the band pass filter 140 does not include a resistor and includes only the capacitor C1 and the inductor L1, a DC path between the power supply voltage VCC and the ground voltage VSS may not be formed. In other words, the DC path may not be formed by the band pass filter 140, and thus power consumption of the memory chip 120 may be reduced. Based on a simulation result, about 62.5% of an average current may be reduced in the memory chip 120 in the memory package 100 according to embodiments, in comparison with a conventional memory chip.

Although not illustrated in FIGS. 2 and 3, configurations of the second receiver 134, the second band pass filter 150 connected to the second receiver 134, and the second path for transmitting the second data signal D2 to the second receiver 134 that are included in the second memory chip 130 in FIG. 1 may be substantially the same as configurations of the first receiver 124, the first band pass filter 140 and the first path P1 discussed with reference to FIGS. 2 and 3, respectively. In some embodiments, the first path P1 and the second path may be connected to the same channel CH or different channels.

Figure 4:
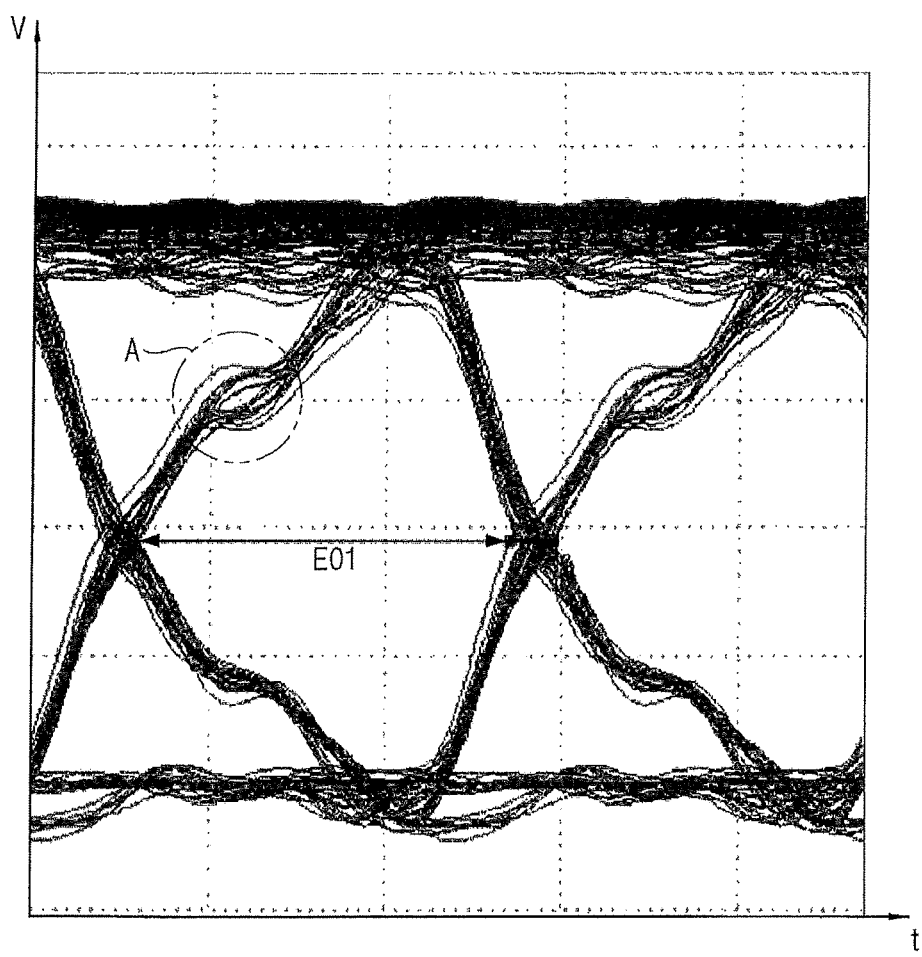
FIGS. 4 and 5 are diagrams illustrating operations of a memory package according to some embodiments of the present inventive concept.
Figure 5:
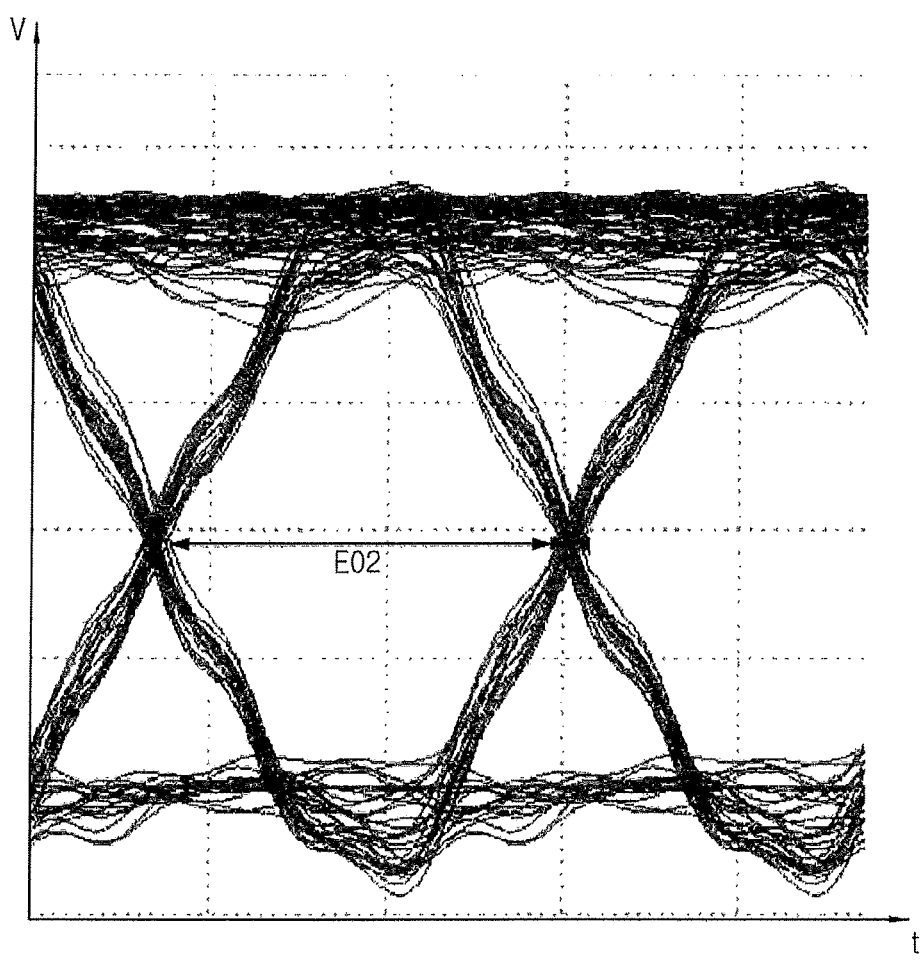

FIGS. 4 and 5 are diagrams illustrating operations of a memory package according to some embodiments. FIG. 4 is an eye-diagram of a data signal that is received by a conventional memory chip without performing the ODT operation (e.g., a conventional memory chip with un-termination condition). FIG. 5 is an eye-diagram of the first data signal D1 that is received by the first memory chip 120 connected to the first band pass filter 140 in FIG. 1. In FIGS. 4 and 5, a horizontal axis represents time t, and a vertical axis represents a voltage level V of a data signal.

Referring to FIGS. 1, 3, 4 and 5, an eye opening ratio EO1 in the eye-diagram of FIG. 4 (e.g., the eye-diagram of the data signal that is received by the conventional memory chip) may be about 89.5%, and an eye opening ratio EO2 in the eye-diagram of FIG. 5 (e.g., the eye-diagram of the first data signal D1 that is received by the first memory chip 120) may increase to about 93.4%. It may be verified that signal integrity is improved or enhanced.

Furthermore, a ringing (e.g., a portion A in FIG. 4) may exist during rising time in the eye-diagram of FIG. 4, however, a ringing may be removed in the eye-diagram of FIG. 5. It may be verified that signal integrity is improved or enhanced based on inductor behavior by the first inductor L1 in the first band pass filter 140 and blocking of high frequency noise by the first band pass filter 140.

Further, in comparison with a slope of rising time in the eye-diagram of FIG. 4, a slope of rising time in the eye-diagram of FIG. 5 may increase because the first load capacitor CL1 in the first receiver 124 and the first capacitor C1 in the first band pass filter 140 are connected in series and a total capacitance is reduced.

As discussed above, when the band pass filter 140 is connected to the receiver 124 included in the memory chip 120 according to embodiments, overall signal integrity associated with data reception of the memory chip 120 may be improved or enhanced based on pass/stop characteristics of the band pass filter 140.

Figure 6:
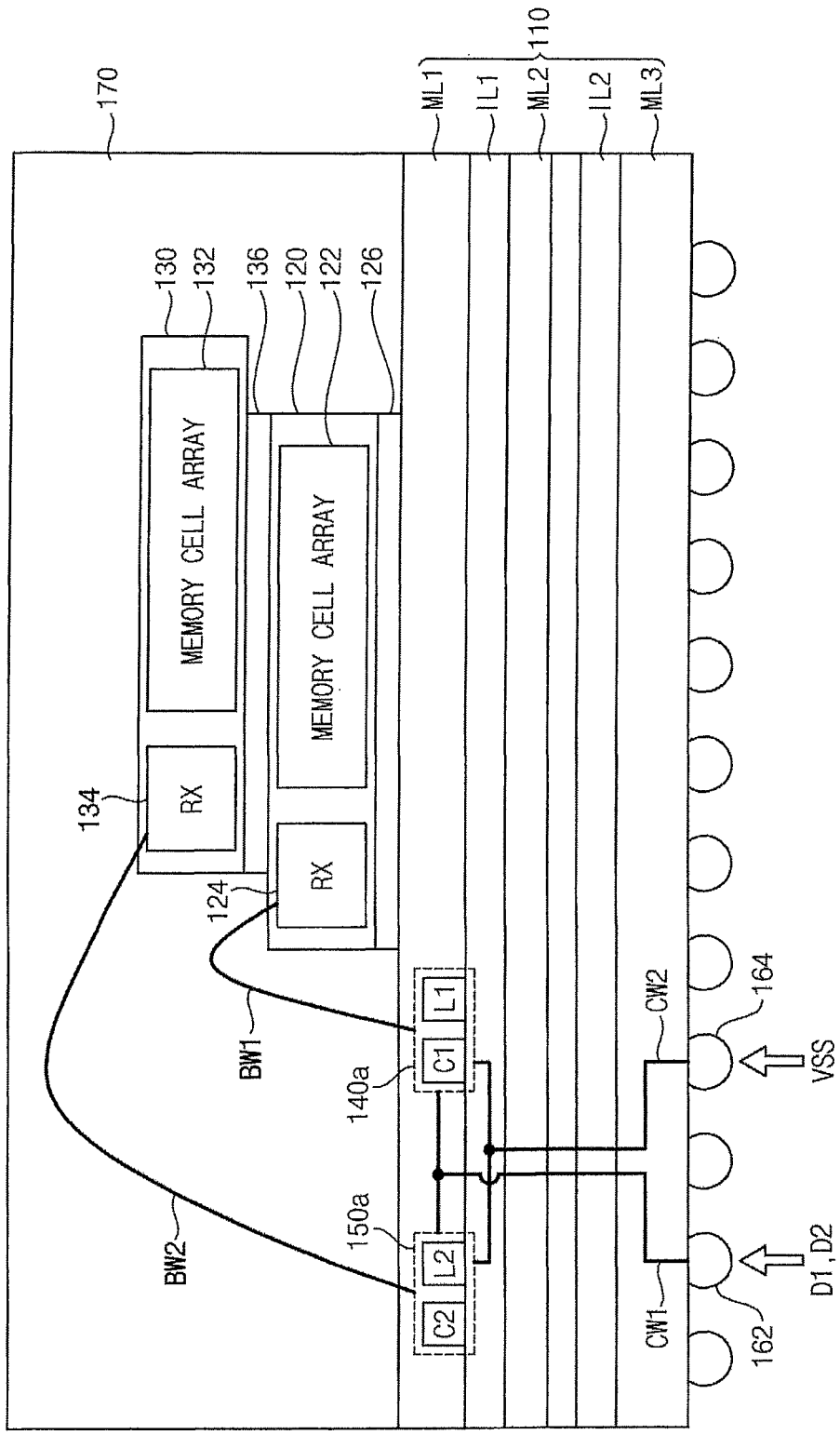
FIG. 6 is a cross section illustrating a memory package according to some embodiments of the present inventive concept.

FIG. 6 is a cross section illustrating a memory package according to some embodiments. The descriptions repeated with FIG. 1 are omitted. As illustrated in FIG. 6, a memory package 100a includes a multi-level package substrate 110, a first memory chip 120, a second memory chip 130, a first band pass filter 140a and a second band pass filter 150a. The memory package 100a may further include a plurality of adhesive members 126 and 136, a plurality of conductive bumps 162 and 164, a plurality of connection lines CW1 and CW2, a plurality of bonding wires BW1 and BW2, and a sealing member 170.

The memory package 100a of FIG. 6 may be substantially the same as the memory package 100 of FIG. 1, except that the first band pass filter 140 and the second band pass filter 150 in FIG. 1 are changed to the first band pass filter 140a and the second band pass filter 150a in FIG. 6, respectively.

In some embodiments, each of the first and second band pass filters 140a and 150a may be implemented with a planar structure. In other words, each of the first and second band pass filters 140a and 150a may include at least one passive element that is included or formed in one wiring layer (e.g., the first wiring layer ML1).

For example, the first band pass filter 140a may include a first capacitor C1 and a first inductor L1 that are connected in parallel with each other. The second band pass filter 150a may include a second capacitor C2 and a second inductor L2 that are connected in parallel with each other. The first capacitor C1, the second capacitor C2, the first inductor L1 and the second inductor L2 may be formed in the first wiring layer ML1. For example, each of the inductors L1 and L2 may be implemented with a coil using metal traces.

Although not illustrated in FIG. 6, each of the first and second band pass filters 140a and 150a may include at least one line or wiring for connecting a respective one of the capacitors C1 and C2 with a respective one of the inductors L1 and L2 in parallel.

Although embodiments are discussed with reference to FIGS. 1 through 6 based on examples where the memory package includes two memory chips 120 and 130 stacked on one another, inventive concepts are not limited thereto. For example, the memory package may implemented with the multi-stacked structure where the memory package includes any number of (e.g., three or more) memory chips stacked on one another, and each memory chip may be connected to at least one band pass filter formed in the multi-level package substrate 110.

Figure 7:
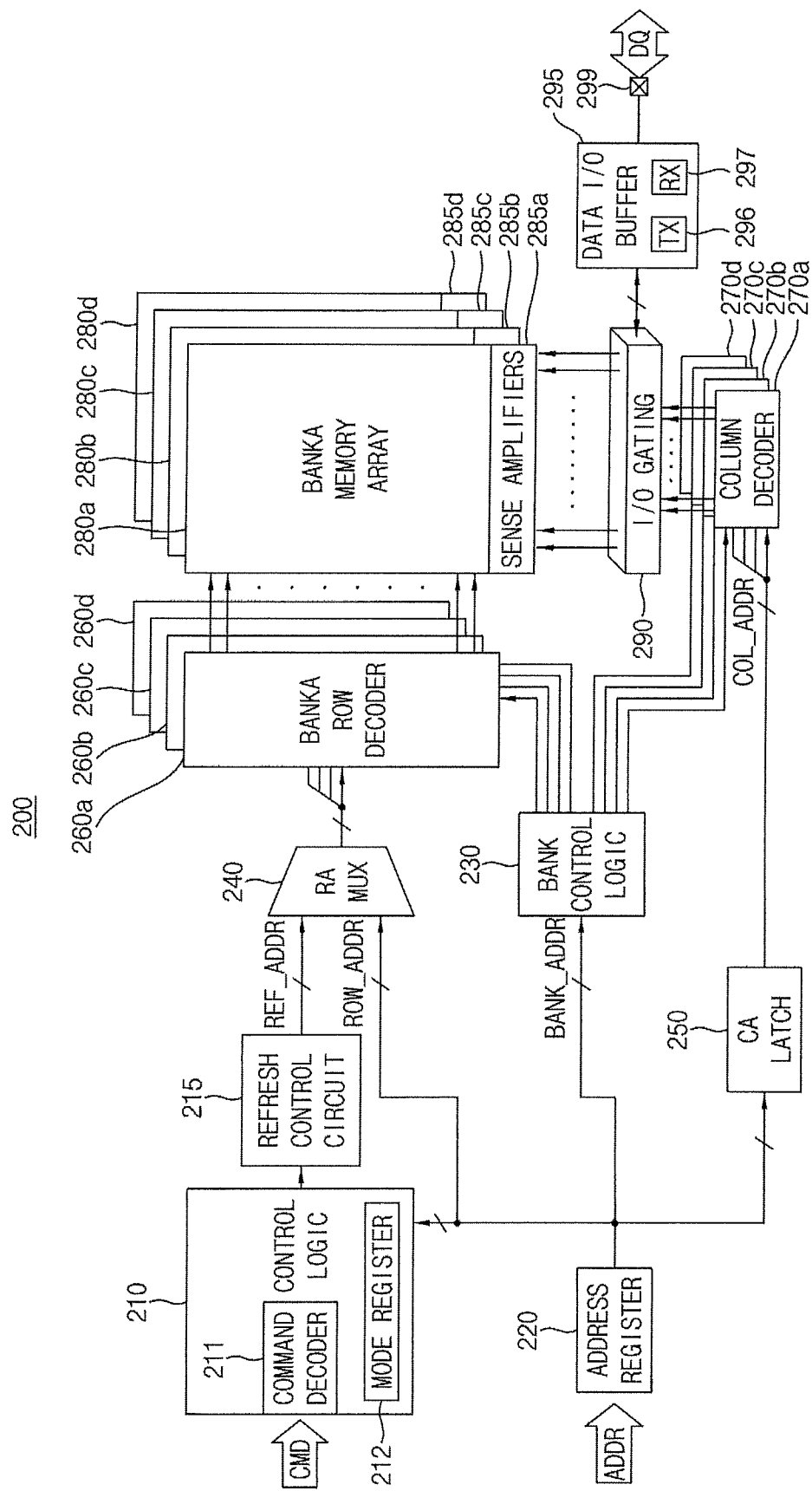
FIG. 7 is a block diagram illustrating a memory chip included in a memory package according to some embodiments of the present inventive concept.

Referring now to FIG. 7, a block diagram illustrating a memory chip included in a memory package according to some embodiments will be discussed. As illustrated in FIG. 7, a memory device 200 includes a control logic circuit 210, a refresh control circuit 215, an address register 220, a bank control logic circuit 230, a row address multiplexer 240, a column address latch 250, a row decoder, a column decoder, a memory cell array, a sense amplifier unit, an input/output (I/O) gating circuit 290, a data I/O buffer 295 and a data I/O pad 299. A person of ordinary skill in the art should understand and appreciate that the inventive concepts are not limited to the quantities of components shown and discussed in FIG. 7.

In some embodiments, the memory device 200 may be one of the memory chips 120 and 130 in FIGS. 1 and 6, and may be, e.g., a volatile memory device. For example, the memory device 200 may be one of various volatile memory devices such as a dynamic random access memory (DRAM), a mobile DRAM, a dual data rate (DDR) DRAM, a low power DDR (LPDDR) DRAM, a graphic DDR (GDDR) DRAM, or the like. For example, the memory device 200 may be a volatile memory device that requires low power consumption.

The memory cell array includes a plurality of memory cells. The memory cell array may include a plurality of bank arrays, e.g., first through fourth bank arrays 280a, 280b, 280c and 280d. The row decoder may include a plurality of bank row decoders, e.g., first through fourth bank row decoders 260a, 260b, 260c and 260d connected to the first through fourth bank arrays 280a, 280b, 280c and 280d, respectively. The column decoder may include a plurality of bank column decoders, e.g., first through fourth bank column decoders 270a, 270b, 270c and 270d connected to the first through fourth bank arrays 280a, 280b, 280c and 280d, respectively. The sense amplifier unit may include a plurality of bank sense amplifiers, e.g., first through fourth bank sense amplifiers 285a, 285b, 285c and 285d connected to the first through fourth bank arrays 280a, 280b, 280c and 280d, respectively.

The first through fourth bank arrays 280a-280d, the first through fourth bank row decoders 260a~260d, the first through fourth bank column decoders 270a~270d, and the first through fourth bank sense amplifiers 285a~285d may form first through fourth banks, respectively. For example, the first bank array 280a, the first bank row decoder 260a, the first bank column decoder 270a, and the first bank sense amplifier 285a may form the first bank; the second bank array 280b, the second bank row decoder 260b, the second bank column decoder 270b, and the second bank sense amplifier 285b may form the second bank; the third bank array 280c, the third bank row decoder 260c, the third bank column decoder 270c, and the third bank sense amplifier 285c may form the third bank; and the fourth bank array 280d, the fourth bank row decoder 260d, the fourth bank column decoder 270d, and the fourth bank sense amplifier 285d may form the fourth bank. Although FIG. 7 illustrates the memory device 200 including four banks, in other embodiments, the memory device 200 may include any number of banks. Nor is there a requirement that the components shown in FIG. 7 in quantities of four have a one-to-one correspondence with each other. In other words, there could be more or less decoders or sensors than shown.

Figure 8:
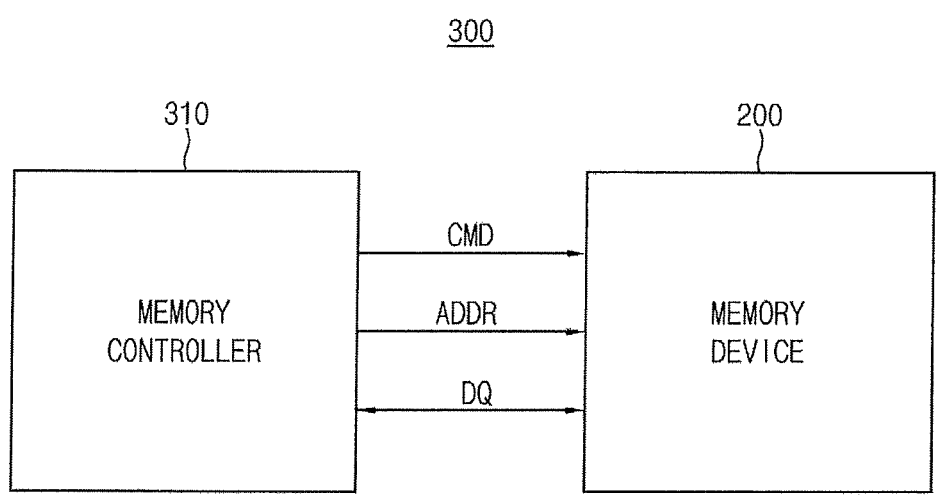
FIG. 8 is a block diagram illustrating a memory system including a memory package according to some embodiments of the present inventive concept.

The address register 220 may receive an address ADDR including a bank address BANK_ADDR, a row address ROW_ADDR and a column address COL_ADDR from a memory controller (e.g., a memory controller 310 in FIG. 8). The address register 220 may provide the received bank address BANK_ADDR to the bank control logic circuit 230, may provide the received row address ROW_ADDR to the row address multiplexer 240, and may provide the received column address COL_ADDR to the column address latch 250.

The bank control logic circuit 230 may generate bank control signals in response to receipt of the bank address BANK_ADDR. One of the first through fourth bank row decoders 260a~260d corresponding to the received bank address BANK_ADDR may be activated in response to the bank control signals generated by the bank control logic circuit 230, and one of the first through fourth bank column decoders 270a~270d corresponding to the received bank address BANK_ADDR may be activated in response to the bank control signals generated by the bank control logic circuit 230.

The refresh control circuit 215 may generate a refresh address REF_ADDR in response to receipt of a refresh command or entrance of any self refresh mode. For example, the refresh control circuit 215 may include a refresh counter that is configured to sequentially change the refresh address REF_ADDR from a first address of the memory cell array to a last address of the memory cell array. The refresh control circuit 215 may receive control signals from the control logic circuit 210.

The row address multiplexer 240 may receive the row address ROW_ADDR from the address register 220, and may receive the refresh address REF_ADDR from the refresh control circuit 215. The row address multiplexer 240 may selectively output the row address ROW_ADDR or the refresh address REF_ADDR. A row address output from the row address multiplexer 240 (e.g., the row address ROW_ADDR or the refresh address REF_ADDR) may be applied to the first through fourth bank row decoders 260a~260d.

The activated one of the first through fourth bank row decoders 260a~260d may decode the row address output from the row address multiplexer 240, and may activate a wordline corresponding to the row address. For example, the activated bank row decoder may apply a wordline driving voltage to the wordline corresponding to the row address.

The column address latch 250 may receive the column address COL_ADDR from the address register 220, and may temporarily store the received column address COL_ADDR. The column address latch 250 may apply the temporarily stored or received column address COL_ADDR to the first through fourth bank column decoders 270a~270d.

The activated one of the first through fourth bank column decoders 270a~270d may decode the column address COL_ADDR output from the column address latch 250, and may control the I/O gating circuit 290 to output data corresponding to the column address COL_ADDR.

The I/O gating circuit 290 may include a circuitry for gating I/O data. For example, although not shown, the I/O gating circuit 290 may include an input data mask logic, read data latches for storing data output from the first through fourth bank arrays 280a~280d, and write drivers for writing data to the first through fourth bank arrays 280a~280d.

Data DQ to be read from one of the first through fourth bank arrays 280a~280d may be sensed by a sense amplifier coupled to the one bank array, and may be stored in the read data latches. The data DQ stored in the read data latches may be provided to the memory controller via the data I/O buffer 295 and the data I/O pad 299. Data DQ received via the data I/O pad 299 that are to be written to one of the first through fourth bank arrays 280a~280d may be provided from the memory controller to the data I/O buffer 295. The data DQ received via the data I/O pad 299 and provided to the data I/O buffer 295 may be written to the one bank array via the write drivers in the I/O gating circuit 290.

The data I/O buffer 295 may include a transmitter (TX) 296 that outputs the data DQ, and a receiver 297 that receives the data DQ. The receiver 297 may correspond to one of the receivers 124 and 134 in FIGS. 1 and 6. As discussed above, an ODT circuit that is connected between the data I/O buffer 295 and the data I/O pad 299 may be omitted in the memory device 200 according to embodiments.

The control logic circuit 210 may control an operation of the memory device 200. For example, the control logic circuit 210 may generate control signals for the memory device 200 to perform a data write operation or a data read operation. The control logic circuit 210 may include a command decoder 211 that decodes a command CMD received from the memory controller and a mode register 212 that sets an operation mode of the memory device 200. For example, the command decoder 211 may generate the control signals corresponding to the command CMD by decoding a write enable signal (e.g., /WE), a row address strobe signal (e.g., /RAS), a column address strobe signal (e.g., /CAS), a chip select signal (e.g., /CS), etc. The control logic circuit 210 may further receive a clock signal (e.g., CLK) and a clock enable signal (e.g., /CKE) for operating the memory device 200 in a synchronous manner.

Referring now to FIG. 8, a block diagram illustrating a memory system including a memory package according to some embodiments of the present inventive concept will be discussed. As illustrated in FIG. 8, a memory system 300 includes a memory controller 310 and a memory device 200. The memory device 200 may be the memory device 200 of FIG. 7 and may correspond to one of the memory chips 120 and 130 in FIGS. 1 and 6.

The memory device 200 is controlled and/or accessed by the memory controller 310. For example, based on requests from an external device (e.g., a host), the memory controller 310 may store (e.g., write) data into the memory device 200, or may retrieve (e.g., read) data from the memory device 200.

The memory controller 310 transmits a command CMD and an address ADDR to the memory device 200 via control signal lines, and exchanges data DAT with the memory device 200 via data I/O lines. At least a part or all of the control signal lines and the data I/O lines may be referred to as a channel.

Although not illustrated in FIG. 8, the memory controller 310 may further transmit a control signal to the memory device 200 via the control signal lines, or may further transmit a power supply voltage to the memory device 200 via the power lines. For example, the control signal may include a data strobe signal (DQS), a chip enable signal (/CE), a write enable signal (/WE), a read enable signal (/RE), a command latch enable signal (CLE), an address latch enable signal (ALE), etc.

The memory device 200 may be implemented with the memory package according to embodiments. For example, the memory device 200 may include the band pass filters 140 and 150 that are formed in the multi-level package substrate 110 and are for replacing the ODT circuit. Accordingly, power consumption may be reduced, and signal integrity may be improved.

In some embodiments, as will be discussed with reference to FIGS. 9 and 10, the memory device 200 and the memory controller 310 may be included in a single semiconductor package.

Figure 9:
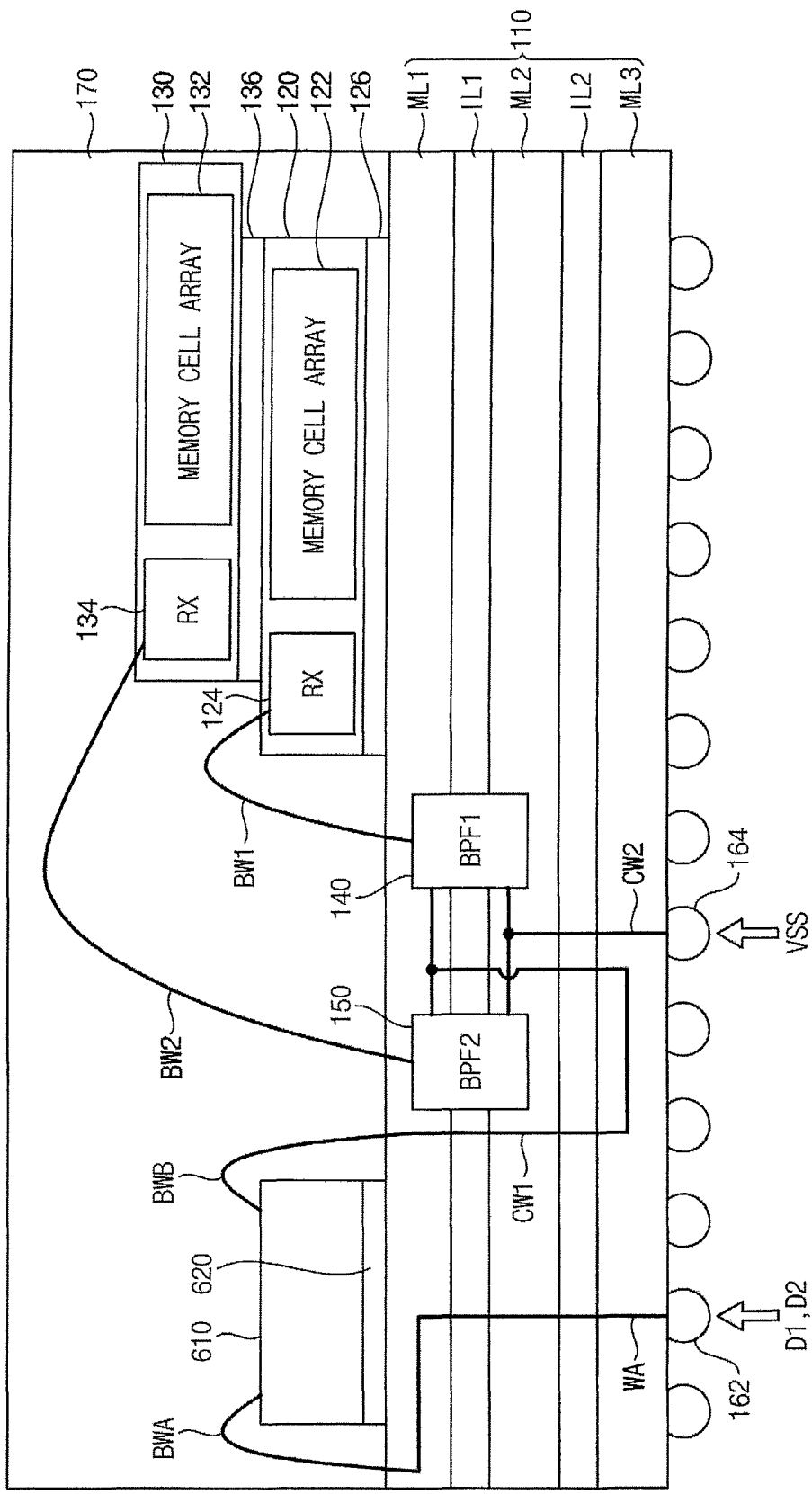
FIGS. 9 and 10 are cross sections illustrating a semiconductor package according to some embodiments of the present inventive concept.
Figure 10:
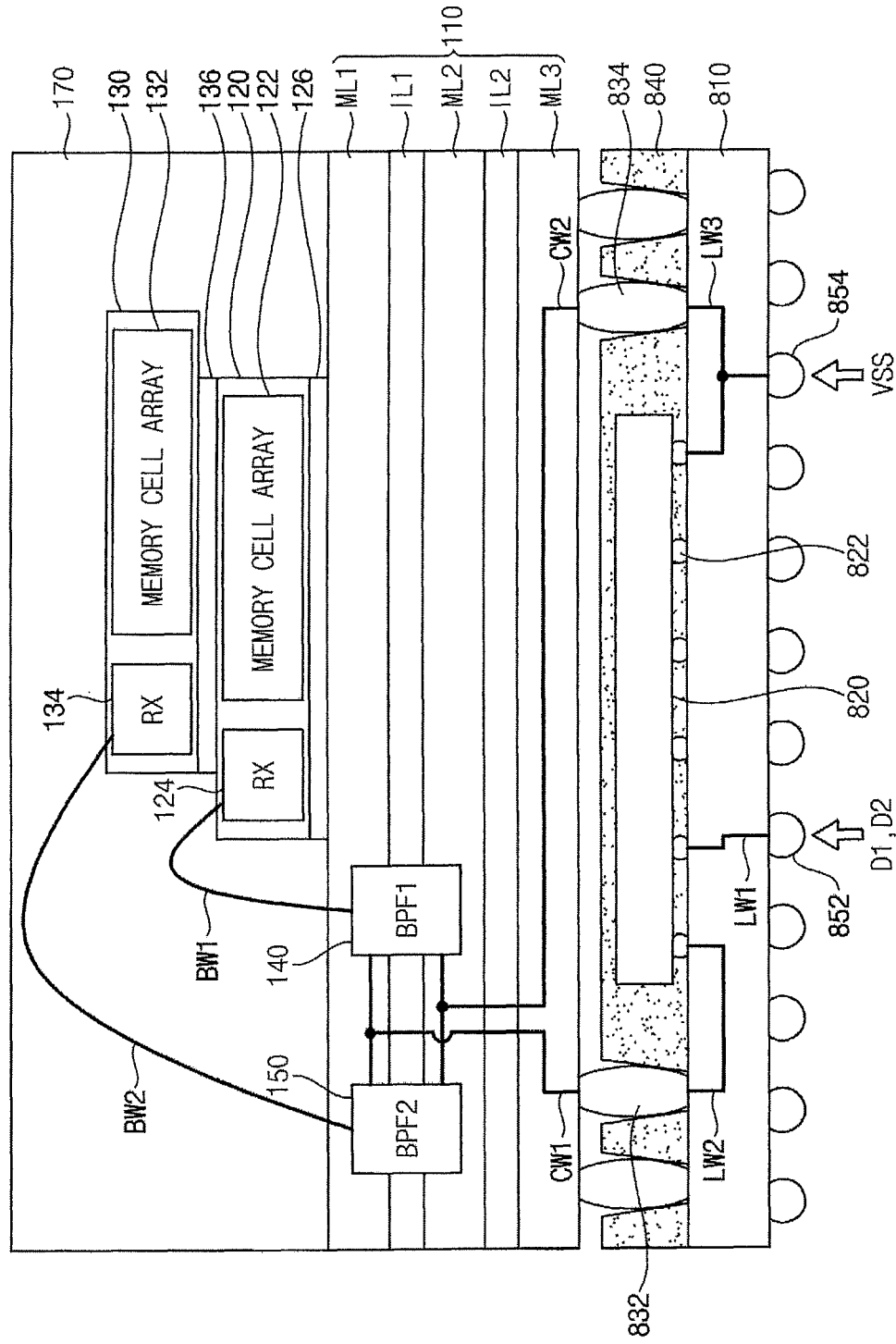

Referring now to FIGS. 9 and 10, cross sections illustrating a semiconductor package according to some embodiments will be discussed. The descriptions repeated with FIG. 1 are omitted. As illustrated in FIG. 9, a semiconductor package 500 includes a multi-level package substrate 110, a controller chip 610, a first memory chip 120, a second memory chip 130, a first band pass filter 140 and a second band pass filter 150. The semiconductor package 500 may further include a plurality of adhesive members 126, 136 and 620, a plurality of conductive bumps 162 and 164, a plurality of connection lines CW1, CW2 and WA, a plurality of bonding wires BW1, BW2, BWA and BWB, and a sealing member 170.

The semiconductor package 500 of FIG. 9 may be similar to the memory package 100 of FIG. 1 and the memory package 100a of FIG. 6, except that the semiconductor package 500 further includes the controller chip 610 and related elements 620, WA, BWA and BWB.

The controller chip 610 is formed on the multi-level package substrate 110 and is spaced apart from the first and second memory chips 120 and 130. The controller chip 610 receives the first data signal D1 and the second data signal D2. The controller chip 610 may correspond to the memory controller 310 in FIG. 8. The adhesive member 620 may intervene between the multi-level package substrate 110 and the controller chip 610.

The first and second data signals D1 and D2 that are received at the first conductive bump 162 may be provided to the controller chip 610 through the connection lines WA and the bonding wire BWB, and may be provided to the first and second receivers 124 and 134 in the first and second memory chips 120 and 130 through the bonding wire BWA, the connection line CW1 and the bonding wires BW1 and BW2. The ground voltage VSS received at the second conductive bump 164 may be provided to the first and second band pass filters 140 and 150. Although not illustrated in FIG. 9, the ground voltage VSS may also be provided to the controller chip 610 and the first and second memory chips 120 and 130.

In some embodiments, the bonding wire BWB, the connection line CW1 and the bonding wire BW1 may be included in or formed on a first signal path. The first signal path may connect the controller chip 610 with the first memory chip 120, and may transmit the first data signal D1 from the controller chip 610 to the first receiver 124. The bonding wire BWB, the connection line CW1 and the bonding wire BW2 may be included in or formed on a second signal path. The second signal path may connect the controller chip 610 with the second memory chip 130, and may transmit the second data signal D2 from the controller chip 610 to the second receiver 134.

In some embodiments, at least a part of the first signal path and the second signal path is formed in the multi-level package substrate. For example, each of the first signal path and the second signal path may include at least one wiring and at least one via that are formed in the multi-level package substrate 110.

As illustrated in FIG. 10, a semiconductor package 700 includes a lower package substrate 810, a controller chip 820, a multi-level upper package substrate 110, a first memory chip 120, a second memory chip 130, a first band pass filter 140 and a second band pass filter 150. The semiconductor package 700 may further include a plurality of adhesive members 126 and 136, a plurality of connection lines LW1, LW2, LW3, CW1 and CW2, a plurality of bonding wires BW1 and BW2, a sealing member 170, a plurality of connection terminals 822, a plurality of vias 832 and 834, a mold layer 840, and a plurality of conductive bumps 852 and 854.

The semiconductor package 700 of FIG. 10 may be similar to the memory package 100 of FIG. 1 and the memory package 100a of FIG. 6, except that the semiconductor package 700 further includes the lower package substrate 810, the controller chip 820 and related elements 822, 832, 834, 840, 852, 854, LW1, LW2 and LW3.

The lower package substrate 810 and the controller chip 820 may form or may be included in a lower package. The multi-level upper package substrate 110, the first memory chip 120, the second memory chip 130, the first band pass filter 140 and the second band pass filter 150 may form or may be included in an upper package. The semiconductor package 700 may be implemented with a package-on-package type semiconductor package in which the upper package is formed on the lower package. The upper package may be substantially the same as the memory package 100 of FIG. 1 and the memory package 100a of FIG. 6.

The controller chip 820 is formed on the lower package substrate 810. The controller chip 820 receives the first data signal D1, the second data signal D2 and the ground voltage VSS. The controller chip 820 may correspond to the memory controller 310 in FIG. 8. The controller chip 820 may be electrically connected to the lower package substrate 810 through the plurality of connection terminals 822 (e.g., solder bumps).

The mold layer 840 may serve as a molding structure encapsulating the controller chip 820, and may also serve as underfiller filling a gap region between the lower package substrate 810 and the controller chip 820.

The plurality of vias 832 and 834 may electrically connect the lower package with the upper package. For example, the mold layer 840 may be patterned to form a plurality of via holes, and the plurality of vias 832 and 834 may be formed in the plurality of via holes.

The plurality of conductive bumps 852 and 854 may be substantially the same as the plurality of conductive bumps 162 and 164 in FIGS. 1 and 6, respectively.

The first and second data signals D1 and D2 that are received at the first conductive bump 852 may be provided to the controller chip 820 through the connection line LW1 and the connection terminal 822, and may be provided to the first and second receivers 124 and 134 in the first and second memory chips 120 and 130 through the connection line LW2, the via 832, the connection line CW1 and the bonding wires BW1 and BW2. The ground voltage VSS received at the second conductive bump 854 may be provided to the controller chip 820 and the first and second band pass filters 140 and 150 through the connection line LW3, the connection terminal 822, the via 834 and the connection line CW2.

In some embodiments, the connection lines LW2 and CW1 and the bonding wire BW1 may be included in or formed on a first signal path. The connection lines LW2 and CW1 and the bonding wire BW2 may be included in or formed on a second signal path.

In some embodiments, at least a part of the first signal path and the second signal path is formed in the controller chip 820 and the multi-level upper package substrate 110.

In some embodiments, the first and second band pass filters 140 and 150 in FIGS. 9 and 10 may be implemented with the vertical structure discussed with reference to FIG. 1, or the planar structure discussed with reference to FIG. 6.

The semiconductor packages 500 and 700 according to embodiments may include the memory package 100 or the memory package 100a discussed with reference to FIGS. 1 through 6, and may be implemented with a single package including the controller chip and the memory chips. Accordingly, the semiconductor package may be efficiently formed, power consumption may be reduced, and signal integrity may be improved.

Figure 11:
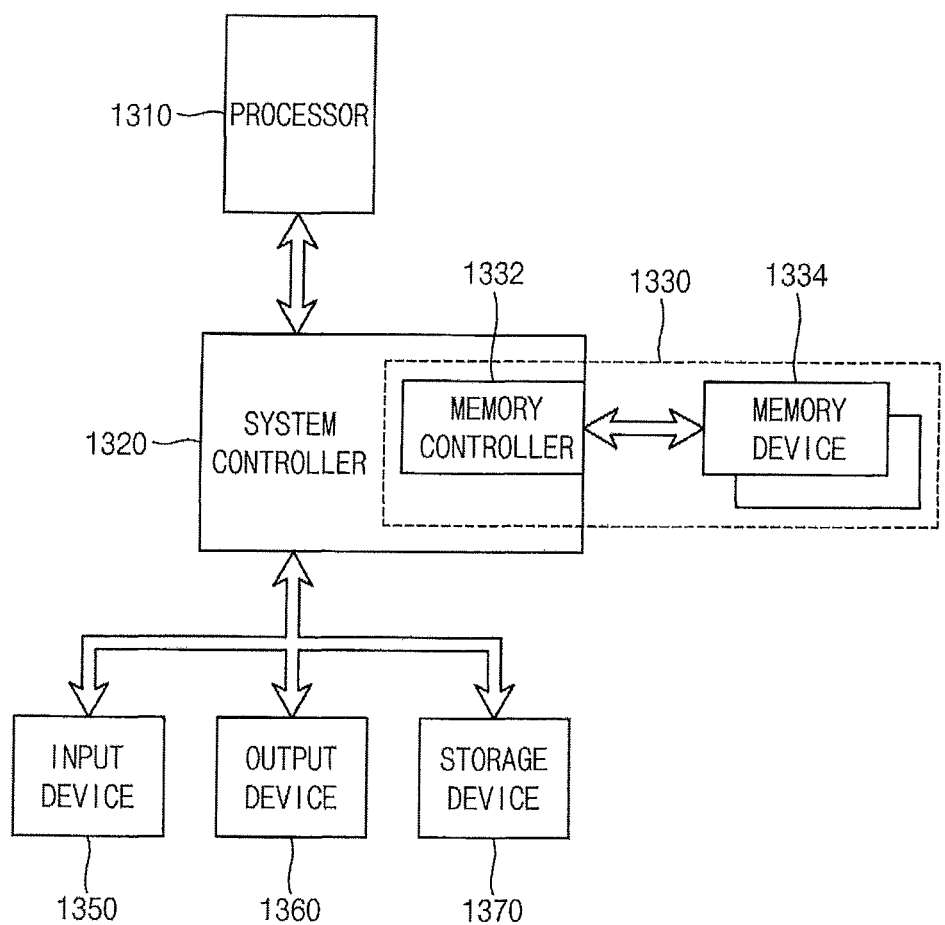
FIG. 11 is a block diagram illustrating a computing system including a memory package and/or a semiconductor package according to some embodiments of the present inventive concept.

Referring now to FIG. 11, a block diagram illustrating a computing system including a memory package and/or a semiconductor package according to some embodiments will be discussed. As illustrated in FIG. 11, a computing system 1300 includes a processor 1310, a system controller 1320 and a memory system 1330. The computing system 1300 may further include an input device 1350, an output device 1360 and a storage device 1370.

The memory system 1330 includes a plurality of memory devices 1334, and a memory controller 1332 for controlling the memory devices 1334. The memory controller 1332 may be included in the system controller 1320. The memory devices 1334 may be implemented with the memory package according to embodiments, or the memory devices 1334 and the memory controller 1332 may be implemented with the semiconductor package according to embodiments.

The processor 1310 may perform various computing functions, such as executing specific software instructions for performing specific calculations or tasks. The processor 1310 may be connected to the system controller 1320 via a processor bus. The system controller 1320 may be connected to the input device 1350, the output device 1360 and the storage device 1370 via an expansion bus. As such, the processor 1310 may control the input device 1350, the output device 1360 and the storage device 1370 using the system controller 1320.

The inventive concept may be applied to various devices and systems that include memory devices and/or memory packages. For example, the inventive concept may be applied to systems such as a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, etc.

The foregoing is illustrative of embodiments and is not to be construed as limiting thereof. Although a few embodiments have been discussed, those skilled in the art will readily appreciate that many modifications are possible in the embodiments without materially departing from the novel teachings and advantages of the present disclosure. Accordingly, all such modifications are intended to be included within the scope of the present disclosure as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A memory package comprising:
   a multi-level package substrate including a plurality of wiring layers and a plurality of insulating layers that are alternately stacked;
   a first memory chip on the multi-level package substrate, the first memory chip including a plurality of first memory cells and a first receiver;
   a second memory chip on the first memory chip, the second memory chip including a plurality of second memory cells and a second receiver;
   a first band pass filter in the multi-level package substrate, the first band pass filter connected to the first receiver and configured to pass a first data signal within a first frequency band; and
   a second band pass filter in the multi-level package substrate, the second band pass filter connected to the second receiver and configured to pass a second data signal within the first frequency band.

2. The memory package of claim 1:
   wherein the multi-level package substrate includes a first wiring layer, a second wiring layer and a first insulating layer between the first wiring layer and the second wiring layer; and
   wherein the first band pass filter includes at least one passive element that is formed substantially vertically with respect to a first surface of the multi-level package substrate such that the at least one passive element is included in both the first wiring layer and the second wiring layer.

3. The memory package of claim 2, wherein the first band pass filter comprises:
   a first capacitor including a first electrode in the first wiring layer and a second electrode in the second wiring layer; and
   a first inductor penetrating the first insulating layer.

4. The memory package of claim 3, wherein the first capacitor and the first inductor are connected in parallel with each other.

5. The memory package of claim 4, wherein the first band pass filter further comprises:
   a first line in the first wiring layer, the first line configured to connect the first electrode of the first capacitor with a first end of the first inductor; and
   a second line in the second wiring layer, the second line configured to connect the second electrode of the first capacitor with a second end of the first inductor.

6. The memory package of claim 5, further comprising:
   a first conductive bump configured to receive the first data signal from an external device;
   a first connection line configured to connect the first conductive bump with the first line; and
   a first bonding wire configured to connect the first line with the first memory chip.

7. The memory package of claim 6, wherein the first conductive bump, the first connection line and the first bonding wire are formed on a first path for transmitting the first data signal to the first receiver.

8. The memory package of claim 6, further comprising:
   a second conductive bump configured to receive a ground voltage from the external device; and
   a second connection line configured to connect the second conductive bump with the second line.

9. The memory package of claim 3, wherein the first capacitor includes a multi-layer ceramic capacitor (MLCC).

10. The memory package of claim 1:
    wherein the multi-level package substrate includes a first wiring layer, a second wiring layer and a first insulating layer between the first wiring layer and the second wiring layer; and
    wherein the first band pass filter includes at least one passive element that is included in one of the first wiring layer and the second wiring layer.

11. The memory package of claim 10, wherein the first band pass filter comprises:
    a first capacitor in the first wiring layer; and
    a first inductor in the first wiring layer, the first capacitor and the first inductor being connected in parallel with each other.

12. The memory package of claim 1, wherein the first band pass filter is connected to a first node on a first path for transmitting the first data signal to the first receiver.

13. The memory package of claim 12, wherein a direct current (DC) path is not formed by the first band pass filter.

14. The memory package of claim 1, wherein each of the first memory chip and the second memory chip includes a dynamic random access memory (DRAM) device.

15. The memory package of claim 14, wherein the first memory chip and the second memory chip have a same structure.

16. A semiconductor package comprising:
    a multi-level package substrate including a plurality of wiring layers and a plurality of insulating layers that are alternately stacked;
    a controller chip on the multi-level package substrate, the controller chip configured to receive a first data signal and a second data signal;
    a first memory chip on the multi-level package substrate and spaced apart from the controller chip, the first memory chip including a plurality of first memory cells and a first receiver;
    a second memory chip on the first memory chip, the second memory chip including a plurality of second memory cells and a second receiver;
    a first band pass filter in the multi-level package substrate, the first band pass filter connected to the first receiver and configured to pass the first data signal within a first frequency band, the first data signal being output from the controller chip; and
    a second band pass filter in the multi-level package substrate, the second band pass filter connected to the second receiver and configured to pass a second data signal within the first frequency band, the second data signal being output from the controller chip.

17. The semiconductor package of claim 16, further comprising:
    a first signal path configured to connect the controller chip with the first memory chip, and to transmit the first data signal from the controller chip to the first receiver; and
    a second signal path configured to connect the controller chip with the second memory chip, and to transmit the second data signal from the controller chip to the second receiver.

18. The semiconductor package of claim 17, wherein at least a part of the first signal path and the second signal path is formed in the multi-level package substrate.

19. A semiconductor package comprising:
    a lower package substrate;
    a controller chip on the lower package substrate, the controller chip configured to receive a first data signal and a second data signal;
    a multi-level upper package substrate on the lower package substrate on which the controller chip is formed, the multi-level upper package substrate including a plurality of wiring layers and a plurality of insulating layers that are alternately stacked;

a first memory chip on the multi-level upper package substrate, the first memory chip including a plurality of first memory cells and a first receiver;

a second memory chip on the first memory chip, the second memory chip including a plurality of second memory cells and a second receiver;

a first band pass filter in the multi-level upper package substrate, the first band pass filter connected to the first receiver and configured to pass the first data signal within a first frequency band, the first data signal being output from the controller chip; and a second band pass filter in the multi-level upper package substrate, the second band pass filter connected to the second receiver and configured to pass a second data signal within the first frequency band, the second data signal being output from the controller chip.

20. The semiconductor package of claim 19, further comprising a via between a lower package and an upper package, the lower package including the lower package substrate and the controller chip, the upper package including the multi-level upper package substrate, the first memory chip and the second memory chip, the via configured to electrically connect the lower package with the upper package.

* * * * *